United States Patent [19]

Lum et al.

[11] Patent Number: 5,403,701
[45] Date of Patent: Apr. 4, 1995

[54] METHOD OF FORMING SMALL GEOMETRY PATTERNS ON PIEZOELECTRIC MEMBRANE FILMS

[75] Inventors: Paul Lum, Los Altos; Belinda J. Kendle, Cupertino; Michael Greenstein, Los Altos, all of Calif.

[73] Assignee: Hewlett-Packard Company, Palo Alto, Calif.

[21] Appl. No.: 85,848

[22] Filed: Jun. 30, 1993

Related U.S. Application Data

[63] Continuation-in-part of Ser. No. 806,501, Dec. 31, 1991, abandoned.

[51] Int. Cl.⁶ .............................................. G03F 7/26
[52] U.S. Cl. .................................... 430/315; 430/329; 156/643; 156/656
[58] Field of Search ................ 430/311, 313, 314, 315, 430/318, 329; 156/643, 656; 310/311, 800

[56] References Cited

U.S. PATENT DOCUMENTS

| | | | |
|---|---|---|---|
| 4,759,823 | 7/1988 | Asselanis et al. | 156/659.1 |
| 4,816,381 | 3/1989 | Kaukeinen | 430/319 |
| 5,052,777 | 10/1991 | Ninnis | 385/19 |
| 5,106,471 | 4/1992 | Galvin | 204/192.35 |
| 5,265,315 | 11/1993 | Hoisington | 29/25.35 |

FOREIGN PATENT DOCUMENTS

| | | |
|---|---|---|
| 112509 | 4/1984 | European Pat. Off. |
| 217064 | 4/1987 | European Pat. Off. |
| 221292 | 4/1985 | German Dem. Rep. |
| 60-0145577 | 2/1985 | Japan . |

OTHER PUBLICATIONS

Collins, G. G. et al., *IBM Jour. Res. Develop.*, vol. 26, 1982, pp. 592–604.

Hatsakis, M. et al., *IBM Jour. Res. Develop.*, vol. 24, 1980, pp. 452–460.

Halverson, R. M. et al., *IBM Jour. Res. Develop.*, vol. 26, 1982, pp. 590–595.

Kimura, K. et al., "Generation of Very High–Frequency Ultrasonic Waves Using Thin Films of Vinylidene Fluoride-Trifluoroethylene Copolymer," *Journal of Applied Physics*, vol. 26, No. 10, May 15, 1987, pp. 4749–4754.

Ohigashi, H. et al., *Ferroelectrics 1984*, vol. 60, Gordon and Breach, 1984, pp. 263–176.

Shearer, M. D. et al., *Ultrasonic Imaging*, vol. 11, 1989, pp. 75–94.

Turnbull, Daniel H., "Two-dimensional Transducer Arrays for Medical Ultrasound Imaging," Ph.D. Thesis, Department of Medical Biophysics, University of Toronto, 1991, pp. 131–134 (publication date, if any, unknown).

*Primary Examiner*—Kathleen Duda

[57] ABSTRACT

A method of patterning interconnect lines on a flexible membrane film of piezoelectric material includes securing the membrane film to a temporary support structure to allow direct patterning of the interconnect lines. A barrier plane is deposited onto the membrane film. A photoresist then coats the barrier plane. In a subsequent step of photolithographically exposing the photoresist, the barrier plane acts as a screen to prevent radiation from reaching the membrane film. The barrier film is also used as a focusing and alignment structure during photolithographic exposure. Optionally, the resulting structure is soaked in chlorobenzene, with the barrier plane functioning to prevent diffusion of the chlorobenzene through the back side of the porous membrane film to form undesired development-retarding regions of the photoresist. Openings are formed in the photoresist during a development step. A metallic interconnect layer is then deposited. A portion of the interconnect layer enters the openings in the photoresist for deposit onto the barrier plane. The barrier plane ensures proper adhesion of the interconnect layer. Lift-off techniques remove the photoresist and unwanted portions of the interconnect layer. The remaining portions of the interconnect layer provide an etch mask for patterning the barrier plane.

19 Claims, 6 Drawing Sheets

METHOD OF FORMING SMALL GEOMETRY PATTERNS ON PIEZOELECTRIC MEMBRANE FILMS

CROSS REFERENCE TO RELATED APPLICATION

This is a continuation-in-part of application Ser. No. 07/806,501, filed Dec. 31, 1991, now abandoned.

TECHNICAL FIELD

The present invention relates generally to piezoelectric membranes and more particularly to fabrication of interconnect lines on a thin, flexible piezoelectric membrane.

BACKGROUND ART

Piezoelectric membrane films are employed in a number of applications. For example, a membrane hydrophone is used as an ultrasonic device for calibrating ultrasonic transducers employed in medical diagnostic and therapeutic operations.

Piezoelectric membrane films typically include electrically conductive electrodes and/or interconnect schemes. Large geometry interconnect schemes and electrodes are fabricated using various techniques, but as the membrane films and the interconnect structures are reduced in size, the choices are also reduced. Currently, electrodes and interconnects are fabricated using discrete printed circuit and flexible circuit technology to form a circuit that is separate from the membrane film, whereafter the separately fabricated circuit is adhered to the membrane film using solder methods or using a polymer adhesive. However, this separate fabrication increases the manufacturing complexity and potentially reduces performance.

As an alternative to formation of discrete printed circuits and flexible circuits, the electrodes and interconnects can be patterned directly onto the piezoelectric membrane film. One difficulty associated with direct patterning is that because the membrane film is flexible, it is susceptible to inadvertent displacement and wrinkling. Moreover, since piezoelectric membrane films are being made increasingly thinner, the likelihood that membrane film handling during direct patterning will cause damage is likewise increasing.

Other difficulties with forming small geometry interconnect schemes by direct patterning onto piezoelectric membrane films depend upon the selection of techniques from among the various fabrication techniques. For example, with regard to "lift-off" processing to pattern interconnects, one difficulty is illustrated in FIG. 1. A thin piezoelectric membrane film 10 is placed atop a metal chuck 12 of a conventional lithograph system. Deposited onto the membrane film 10 is a positive photoresist 14 having a surface portion 16 that is exposed by a mask 18. The mask is exposed to electromagnetic radiation, as represented by arrows 20. The radiation ideally comes into contact only with the region of the positive photoresist 14 directly below the surface portion 16. However, some of the radiation energy will penetrate the photoresist and enter the piezoelectric membrane film 10. Typical piezoelectric materials used in forming membranes such as those for membrane hydrophones are sufficiently thin and transparent to allow the energy to reflect from the metal chuck 12 and return to the photoresist. This reflection is shown by arrows 22. As a result of the reflection, areas of the photoresist 14 that are adjacent to the opening in the mask 18 will be exposed. During a subsequent photoresist development step, an opening in the photoresist will have a width greater than the ideal. Consequently, small geometry interconnect schemes are difficult to achieve using lift-off techniques.

Another difficulty with lift-off techniques is that removing material from the photoresist 14 will typically create an opening that decreases in width with the downward approach toward the film 10 on which the photoresist is deposited. This downwardly narrowing opening causes difficulties in obtaining fine geometries, particularly for lift-off processing. To combat the problem, it is known to soak the structure in the chlorobenzene bath for a period of approximately thirteen minutes following the photoresist exposure step and preceding the development step. The structure shown in FIG. 2 can then be developed. That is, the chlorobenzene creates a development-retarding top layer region of the photoresist 14, so that "lip" areas 24 and 26 are not removed in the subsequent development step. The lip areas facilitate the creation of fine geometry structures by lift-off processing. However, in the piezoelectric membrane film application, the use of a chlorobenzene soak will potentially have adverse effects. The porous nature of a piezoelectric polymer thin membrane film allows the chlorobenzene to diffuse through the membrane film 10 from the back side 28 of the membrane film. Thus, in addition to the development-retarding upper region of photoresist, a development-retarding lower region will be created at the interface of the membrane film and the photoresist. The result is a residual photoresist covering 30 at the opening in the photoresist. This residual covering must be addressed if a metal is to be properly adhered to the membrane film 10.

If photolithographic techniques are to be used for direct patterning, focusing is yet another concern. Focusing on the top surface of the photoresist becomes increasingly more difficult with decreases in the thickness of membrane films and with the narrowing of interconnect lines. The thin membrane film is at least semitransparent. The problems associated with focusing are particularly acute if interconnect patterns are to be formed on both sides of the membrane film. Exposing the photoresist on the a first side of the membrane film may also result in back side exposure of the photoresist on the opposite, second side of the membrane film. Moreover, there are concerns that wrinkling of the membrane film may cause photoresist to be outside of the focal length of the exposing equipment.

Because of the problems associated with direct patterning, the use of separately fabricated circuits that are then adhered to piezoelectric membrane films is known. However, as noted above there are also problems using separate fabrication techniques.

It is an object of the present invention to provide a method for direct patterning of fine geometry electrode and interconnect schemes on a piezoelectric thin membrane film. Preferably, the method is adaptable to forming interconnect schemes on opposed sides of the membrane film.

SUMMARY OF THE INVENTION

The above object has been met by employing a lift-off approach in which a preliminary layer functions as an adhesive, a solvent barrier, a focusing and alignment structure, and an exposure screen that prevents photoresist-exposure radiation from reaching a piezoelectric membrane film on which an electrode and/or interconnect scheme is to be fabricated. The piezoelectric membrane film is secured in a taut condition by a temporary support structure which prevents undesired movements of the membrane film.

The preliminary layer is formed on the piezoelectric membrane film as a barrier plane. A photoresist is then formed on the barrier plane. The barrier plane is made of a material which adheres well to the piezoelectric membrane film. Chromium is a suitable material, but titanium and nickel may also be employed. Optionally, the barrier plane includes focusing and alignment marks for subsequent steps of photolithographic processing. The formation of the barrier plane itself is not a process that requires exacting tolerances, since features having fine geometries are not required.

The photoresist is then exposed to electromagnetic radiation, such as by ultraviolet radiation having a wavelength of 365 nm, to form a latent image of a desired pattern of the electrode and/or interconnect scheme to be fabricated. The barrier layer acts as a screen to prevent the ultraviolet radiation from penetrating into the piezoelectric membrane film and from being reflected back to regions of the photoresist which were intended to be left unexposed. That is, the barrier plane prevents the reflection described above and illustrated in FIG. 1. By screening the membrane film from radiation, the barrier plane limits the exposure of the photoresist to desired areas and facilitates formation of fine geometry interconnects.

The structure comprising the photoresist, barrier layer and membrane film is optionally subjected to a chlorobenzene soak. The chlorobenzene creates a development-retarding top layer region of the photoresist, as described above with reference to FIG. 2. At this step, the barrier plane functions to prevent the chlorobenzene from diffusing through the porous piezoelectric membrane film to create a development-retarding lower region of the photoresist. That is, by acting as a barrier against chlorobenzene leakage through the membrane film to the photoresist, the barrier layer prevents formation of a residual covering of the membrane film following development of the photoresist.

Development of the photoresist exposes selected portions of the barrier plane between remaining regions of the photoresist. A metal layer having a high electrical conductivity is then formed on the exposed selected portions of the barrier plane and on the remaining regions of the photoresist. Removal of the photoresist leaves an electrode and/or interconnect scheme atop the barrier layer. An etchant that selectively removes the barrier layer is utilized to transfer the desired scheme to the barrier layer. The metal that was previously deposited on the barrier layer acts as an etch mask. Consequently, the desired scheme comprises the patterned barrier plane and the upper metallic material. As previously stated, the metal used for forming the barrier plane is selected according to the properties that ensure proper adhesion to the piezoelectric membrane film. Another consideration is the proper electrical conductivity. The metal atop the barrier plane is selected primarily for its conductive properties.

The piezoelectric membrane film is preferably poly vinylidene fluoride (PVDF) or a copolymer, e.g. PVDF copolymerized with trifluoroethylene. Such piezoelectric materials are polymeric and less brittle than piezoelectric ceramics which would require more complex manufacturing steps, e.g., securing the piezoelectric ceramic membrane film to a less brittle membrane film that would be secured to the temporary support structure.

The piezoelectric membrane film may then be removed from the temporary support structure and used for its intended purpose. An advantage of the present invention is that the resulting fine line interconnects that are directly patterned onto the piezoelectric membrane film potentially increase performance in exacting transducer applications such as high frequency intravascular arrays, high frequency hydrophones for sensitive array characterization studies, and multi-dimensional imaging arrays.

BEST MODE FOR CARRYING OUT THE INVENTION

Figure 3:
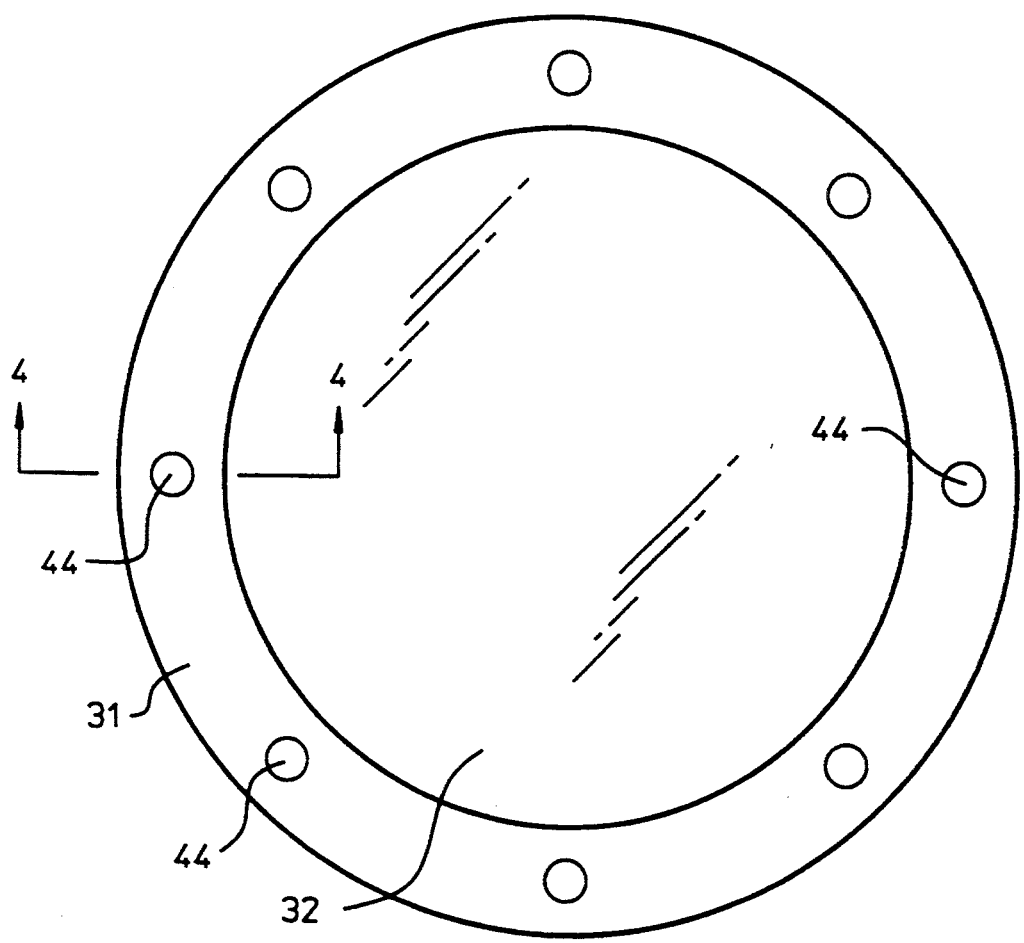
FIG. 3 is a top view of a double hoop temporary support structure for a polymeric piezoelectric membrane film in accordance with the present invention.
Figure 4:
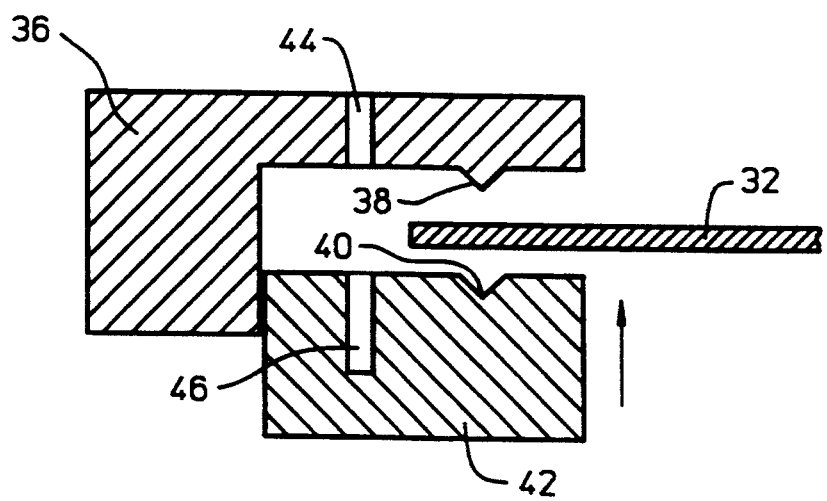
FIG. 4 is a partial side sectional view of the temporary support structure of FIG. 3, taken along lines 4—4.

With reference to FIGS. 3 and 4, a temporary support structure 31 is employed to secure a polymeric piezoelectric membrane film 32 in a manner to provide a surface that is both planar and free from wrinkles. The temporary support structure is a double-hoop assembly in which an upper member 36 includes a wedge tooth 38 that is received within a notch 40 of a lower member 42. The tooth-and-notch structure applies a sufficient material displacement for stretching the piezoelectric membrane film 32 and for locking the membrane film in place. After the piezoelectric membrane film has been properly stretched and secured to the temporary support structure, the membrane film is in a planar condition for deposition and patterning of a desired electrode and/or interconnect scheme. The two-dimensional strain provided by the support structure achieves the adequate planarity for photolithography. Fastening screws, not shown, may then be inserted through a bore 44 in the upper member 36 for tightening into internally threaded openings 46 in the lower member 42.

Figure 5:
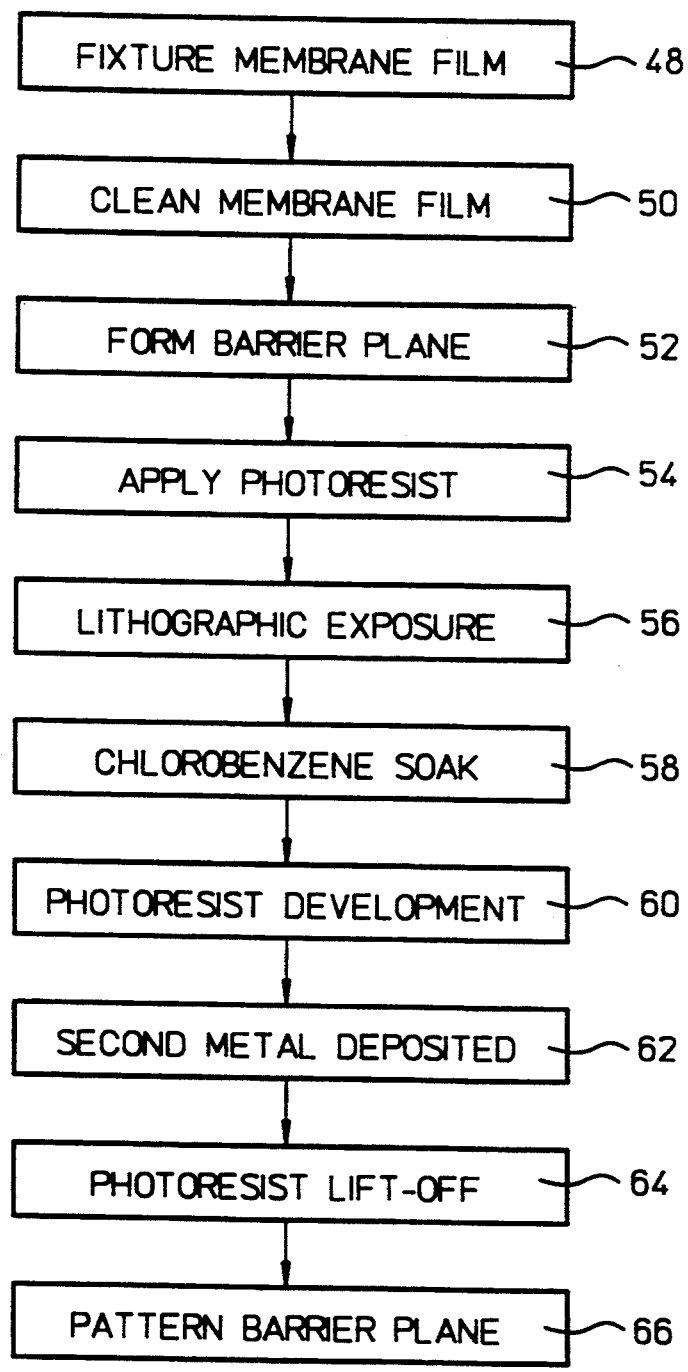
FIG. 5 is a flow chart illustrating a method of forming an interconnect scheme on one side of the piezoelectric membrane film of FIG. 3.

FIG. 5 illustrates a sequence in which an interconnect scheme is fabricated on only one side of the piezoelectric membrane film. The membrane film preferably has a thickness in the range of 4–100 $\mu$m after undergoing stretching in step 48. A cleaning operation is then performed on the opposed major surfaces of the membrane film, with care being taken not to deform or perforate the thin piezoelectric membrane film. The cleaning step 50 includes a first series of wipes with trichloroethane. A different cloth is used for each separate wipe in the first series. A second series also includes three wipes with different cloths, but the second series utilizes n-propanol as the solvent. The membrane film is blown dry with a dry nitrogen gas. Each of the gases preferably is 0.2 micron filtered.

In step 52, a barrier plane is formed on the piezoelectric membrane film. The formation of the barrier plane does not require fine-geometry techniques, since the barrier plane is to completely cover any areas of the membrane film on which electrodes and interconnects are to be patterned. For example, in FIG. 6 a barrier plane 68 is shown as a rectangular region to completely cover the area of the polymeric piezoelectric membrane film 32 which is to contain the critical line-width interconnect patterns. Also shown are a pair of focus and alignment marks 70 and 72 formed during the formation of the barrier plane for use in photolithographic steps to follow.

The barrier plane 68 is formed of a conductive metal having properties which ensure proper adhesion to the polymeric membrane film 32. Chromium is the preferred metal, but other suitable metals include titanium and nickel. The barrier plane may have a thickness in the range of 200–400 Å. The barrier plane serves the purposes of: (1) screening the membrane film from photolithographic exposure; (2) providing a focusing and alignment structure 70 and 72; (3) preventing a chlorobenzene soak from forming a development-retarding residual coating at the interface of the membrane film and barrier plane; and (4) ensuring proper adhesion of an electrode and/or interconnect scheme to the membrane film.

In a preferred embodiment, an adhesion promoter, such as hexamethyldisilazane, is applied onto the piezoelectric polymer membrane film 32. The adhesion promoter should be allowed to remain on the surface of the membrane film for at least thirty seconds before a spin dry at 3000 rpm for sixty seconds.

Figure 6:
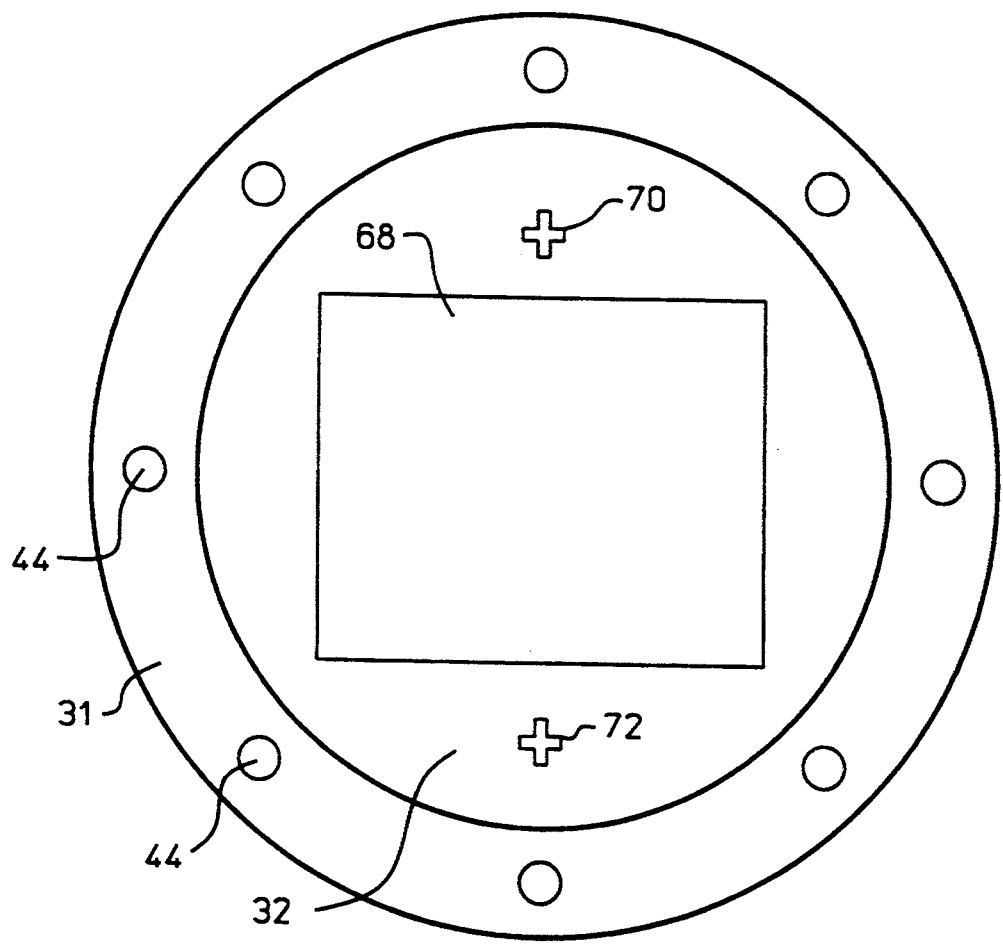
FIGS. 6–10 are side sectional views of processing steps set forth in the flow chart of FIG. 5.

Referring now to FIGS. 5 and 6, a positive photoresist is employed to cover the barrier plane 68 and piezoelectric membrane film 32. The application of the photoresist is shown as step 54. A suitable photoresist is Hoechst AZ-1350. The positive photoresist may be applied by spin coating the material to a thickness of 1.5 $\mu$m–3.0 $\mu$m, whereafter the photoresist may be hotplate softbaked at 90° C. for sixty seconds.

Figure 1:
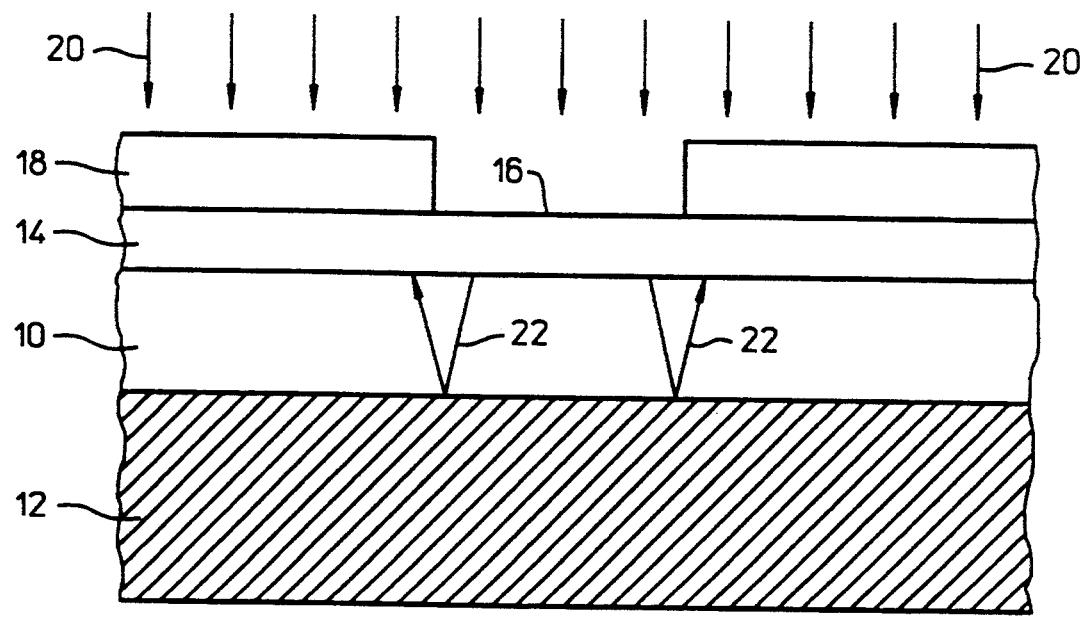
FIG. 1 is a side view of an exposure of a masked photoresist layer on a support using prior art techniques.

The positive photoresist is then irradiated, in step 56, to define the selected electrode/interconnect scheme, using either (1) contact proximity and a contact mask with a light source, such as a 250 watt source or (2) an ultraviolet direct write method at a wavelength such as 365 nm from a 500 watt ultraviolet light source. The radiation time may be within the range of 10–120 seconds, with twenty seconds being a representative time period. The irradiation to produce the selected pattern preferably occurs by rastering, with a pixel area of about 2 $\mu$m². The lithographic processes utilizing contact proximity or ultraviolet direct write are common techniques employed in the semiconductor and integrated sensors processing technology industry. In this step, the barrier plane acts as a screen to prevent the reflected radiation from exposing areas of photoresist intended to remain unexposed, i.e., the barrier plane prevents reflection of the type shown in FIG. 1.

Figure 2:
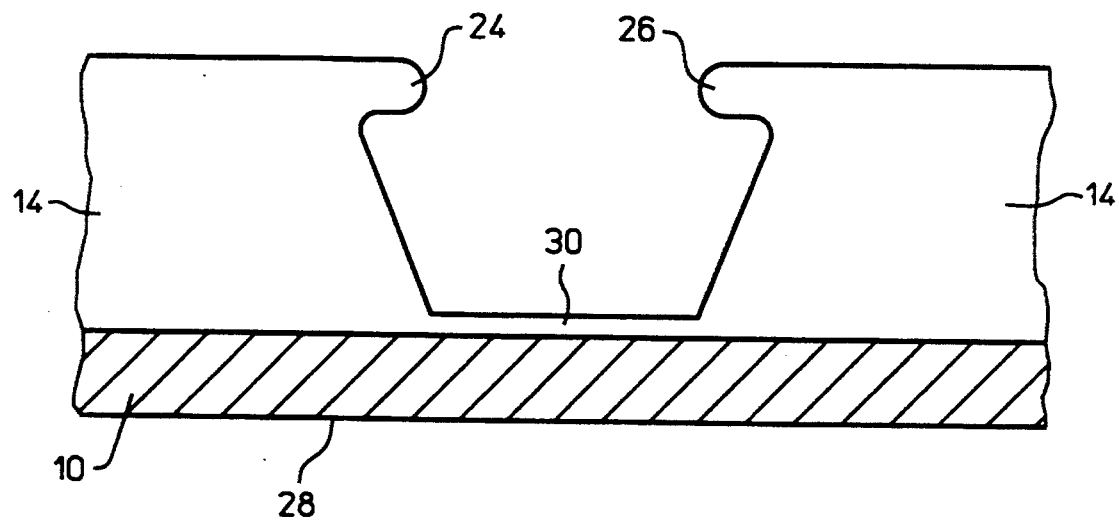
FIG. 2 is a side sectional view of a developed photoresist layer using prior art techniques.

A chlorobenzene soak may then be utilized. The soak is shown as step 58 in FIG. 5. The piezoelectric polymer membrane film 32, the barrier plane 68 and the positive photoresist are entered into a chlorobenzene bath for a period of approximately thirteen minutes at a temperature in the range of 20°–30° C. As described above with reference to FIG. 2, the desirable results of such a soak are that the chlorobenzene will diffuse into the upper region of photoresist material 14 to create a development-retarding region at exposed portions of the photoresist. Subsequent development creates lip areas 24 and 26 that aid in lift-off processing. However, with use of a piezoelectric polymer membrane film, chlorobenzene will also diffuse through the back side 28 of the porous membrane film. Consequently, a thin development-retarding covering 30 is likely to result.

The formation of the barrier plane 68 described with reference to FIGS. 5 and 6 prevents chlorobenzene from soaking through the membrane film 32 in the manner described above. Thus, while the chlorobenzene soak is not critical to the present invention, the use of the barrier layer provides a structure which permits the use of chlorobenzene or a comparable solvent to form the lip areas, without rendering the structure susceptible to formation of an undesired development-retarding residue at a film/photoresist interface.

Excess chlorobenzene is then exhausted from the surface of the structure by an inert gas, such as $N_2$. In step 60, the exposed photoresist material is developed using a developer solution such as a KOH-based solution sold by Shipley. Development is at a temperature of approximately 25° C. for a time interval of 60–120 seconds to remove exposed portions of the photoresist material, thereby exposing underlying portions of the barrier plane 68. The developed structure is then rinsed in deionized water and blown dry using $N_2$ gas for a time interval of 60–120 seconds to remove all liquids.

Figure 7:
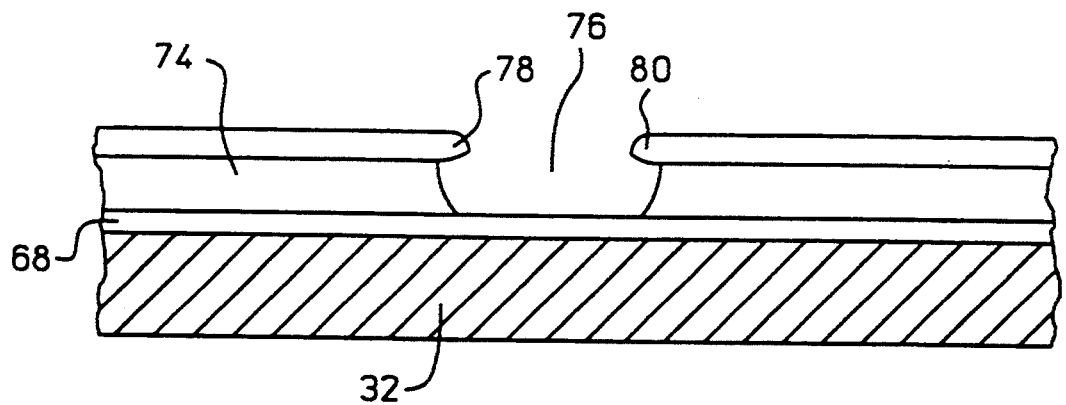
Figure 8:
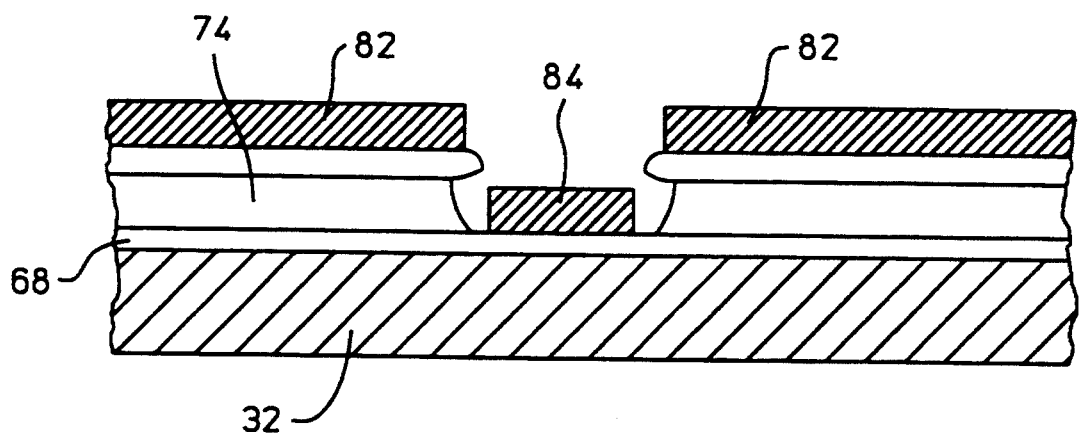

FIG. 7 illustrates a developed positive photoresist layer 74 atop the barrier plane 68 on the piezoelectric polymer membrane film 32. An opening 76 is formed during the development to expose a portion of the barrier plane. Where the above-described chlorobenzene soak is utilized, lip areas 78 and 80 will surround the opening 76. Referring now to FIGS. 5 and 8, in step 62 a metal having a high electrical conductivity, such as gold, is deposited on the photoresist layer 74 to form a metallic layer 82. The metallic layer may have a thickness of 2000–4000 Å, which is approximately ten times as thick as the barrier plane 68. A portion 84 of the metallic layer 82 is deposited directly onto the exposed portion of the barrier layer 68. The gold would not adhere sufficiently to the piezoelectric polymer membrane film 32, but the barrier layer ensures proper adhesion.

The process for depositing the metallic layer 82 is not critical. Resistive source thermal evaporation or electron beam source thermal evaporation may be utilized. A typical vacuum evaporation deposition system common in the semiconductor processing industry may be used. The fixtured piezoelectric polymer membrane film 32 is suspended above the metal deposition source in an evaporation chamber of the deposition system and the metal is deposited using a vacuum of 10 E-7 torr. The same deposition process may be utilized in forming the barrier layer 68.

Figure 9:
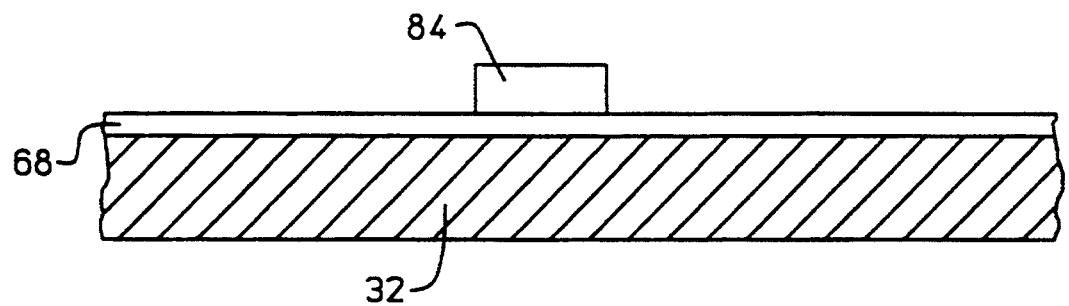

The photoresist layer 74 is then removed at step 64. Removal may be achieved by use of an acetone bath at room temperature for a time interval of 60–180 seconds. A sonicator may be employed. In FIG. 9, the resulting structure is shown as one in which only that portion 84 of the metallic layer that was in contact with the barrier plane 68 remains after photoresist lift-off. The portion 84 defines an interconnect line of a desired electrode/interconnect scheme.

Figure 10:
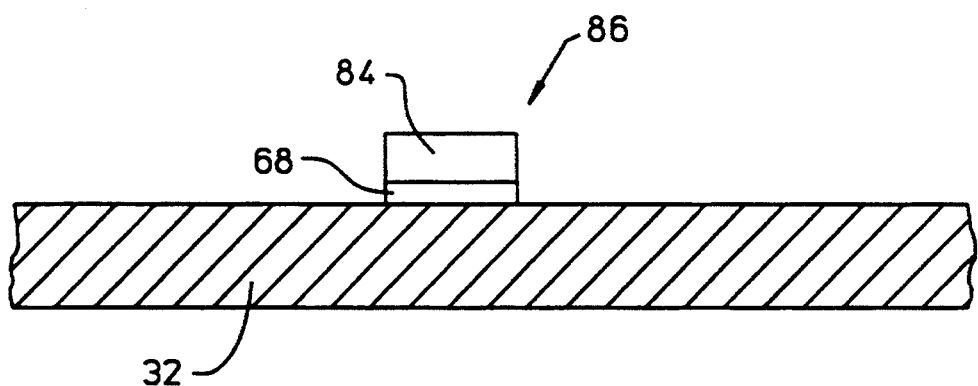

The portion 84 of the metallic layer is then used as an etch mask for patterning the barrier plane, as shown at step 66 in FIG. 5. The etching chemical must be selective to etching the material of the barrier plane relative to the metallic portion 84. Where chromium is utilized to form a metallic barrier plane 68 and gold comprises the metallic portion 84, a suitable etchant is sold as C-7 by Cyantek Corporation. The etching chemical would then be applied at 25° C. to etch the chromium at a rate of 20 Å per second. As a result, an interconnect 86 is shown in FIG. 10 as being formed on the piezoelectric polymer membrane film 32. The interconnect 86 may have a lateral dimension, or width, of less than 25.4 μm.

If the opposed surface of the piezoelectric polymer membrane film 32 is to be provided with an interconnect scheme, the interconnect 86 on the first surface is protected by a polyimide or photoresist layer before the second surface pattern is formed. The focus and alignment marks 70 and 72 are employed to facilitate optical alignment of the pattern on the second surface relative to the pattern deposited on the first surface. The steps 48-66 of FIG. 5 are then followed in forming the second surface pattern, whereafter the protective coating of polyimide or photoresist on the first surface is removed using an acetone or butyl acetate bath.

Where active circuitry is to be formed on one of the surfaces of the piezoelectric polymer membrane film, a multi-layer interconnect process may be necessary. For example, in the formation of a membrane hydrophone, the first surface of the membrane film may have a preamplifier fabricated thereon. Where multilayer interconnect processing is employed, the structure of FIG. 10 may be coated with a spun-on polyimide layer, such as Amoco 1414. The polyimide layer may have a thickness of 0.5 μm to 2.0 μm, dependent upon the dielectric protection requirements of the circuitry. The polyimide layer is softbaked at an approximate temperature of 120° C. for 200 seconds. An interconnect via patterning layer of photoresist is then spun over the polyimide layer after an oxygen plasma treatment is carried out for sixty seconds at 100 watts, using 100 percent $O_2$ at a pressure of 150 millitorr. After the photoresist material has been softbaked at a temperature of approximately 100° C., a via contact hole pattern, aligned to the preceding layer pattern, is deposited and exposed. Exposed photoresist material is developed and the via contact holes are opened in the underlying polyimide layer with an n-butanol-based solvent by spray or immersion etching. The remaining photoresist material is then stripped from the polyimide, using a dilute solution of n-butyl acetate-based solvent. An interconnect metal is deposited to provide an upper interconnect layer that is electrically joined to a lower interconnect layer.

In the preferred embodiment, the membrane film is PVDF or a copolymer of PVDF, e.g., P(VDF-TrFE). A polymeric piezoelectric film is less brittle than piezoelectric ceramics of comparable thickness.

We claim:

1. A method of forming a pattern of interconnect lines on a thin flexible membrane of piezoelectric material comprising:

securing a flexible piezoelectric membrane to a support structure such that said flexible piezoelectric membrane is in a taut condition, thereby reducing flexing of said membrane;

forming an electrically conductive lower barrier plane on a first surface of said flexible piezoelectric membrane;

forming a photoresist layer on said lower barrier plane;

patterning said photoresist layer including exposing selected portions of said lower barrier plane;

forming electrically conductive upper interconnect lines on said selected portions of said lower barrier plane;

removing said photoresist layer, while leaving said upper interconnect lines; and removing said lower barrier plane which has been exposed after removed of said photoresist layer such that a desired interconnection pattern remains on said flexible piezoelectric membrane, including leaving said lower barrier plane covered by said upper interconnect lines.

2. The method of claim 1 wherein removing said lower barrier plane includes utilizing said upper interconnect lines as an etch mask.

3. The method of claim 1 wherein forming said upper interconnect lines and removing said photoresist layer are steps of a lift-off process.

4. The method of claim 1 wherein securing said flexible piezoelectric membrane to said support structure includes providing a flexible piezoelectric membrane having a thickness of greater than 4 μm and less than 100 μm in a faint condition.

5. The method of claim 1 wherein forming said lower barrier plane includes creating marks for subsequently aligning and focusing lithographic equipment on said photoresist layer.

6. The method of claim 1 wherein patterning said photoresist layer is a step utilizing photolithographic techniques.

7. The method of claim 1 further comprising forming a second interconnection pattern on a second surface of said flexible piezoelectric membrane opposite to said first surface, said forming said second interconnection scheme including forming a second barrier plane on said second surface and patterning a second photoresist layer on said second barrier plane, including exposing portions of said second barrier plane and depositing second interconnect lines on said portions.

8. The method of claim 7 wherein forming said second interconnection pattern is preceded by a step of coating said first surface with a protective coating.

9. The method of claim 1 wherein securing said flexible piezoelectric membrane includes providing a membrane made of a polymer including poly vinylidene fluoride.

10. The method of claim 1 further comprising releasing said flexible piezoelectric membrane from said support structure following partially removing said lower barrier plane.

11. A method of forming small geometry conductive patterns on a piezoelectric membrane film comprising the steps of:

(1) providing a membrane film made of a piezoelectric material having a thickness less than 100 μm;

(2) supporting said membrane film in a fixed planar position;

(3) forming a conductive barrier film on a first surface of said membrane film;

(4) forming a resist layer on said barrier film;

(5) photolithographically patterning said resist layer to form a desired configuration of resist and to expose regions of said conductive barrier film;

(6) forming a conductive film on said configuration of resist and said regions of said conductive barrier film;

(7) removing said configuration of resist while leaving said conductive film on said regions of said conductive barrier film; and (8) etching said conductive barrier film to remove portions of said conduction barrier film not covered by said conductive film, thereby forming a multi-film pattern for the conduction of signals.

12. The method of claim 11 wherein forming said conductive barrier film includes depositing chromium.

13. The method of claim 11 wherein forming said multi-film pattern includes fabricating interconnect lines having a width of less than 25.4 μm.

14. The method of claim 11 wherein forming said conductive barrier film includes forming alignment and focusing marks for said patterning of said resist layer.

15. The method of claim 11 further comprising forming a second multi-film pattern on a second surface of said membrane film.

16. A method of forming a pattern of interconnect lines on a thin flexible membrane of piezoelectric material comprising the steps of:

(1) securing a flexible piezoelectric membrane to a support structure such that said flexible piezoelectric membrane is stretched into a taut condition;

(2) on a first side of said flexible piezoelectric membrane, forming a conductive barrier plane;

(3) depositing a photoresist on said conductive barrier plane;

(4) photolithographically patterning said photoresist to define openings to selected regions of said conductive barrier plane;

(5) forming an interconnect layer atop the patterned photoresist and said selected regions of said conductive barrier plane;

(6) utilizing lift-off techniques to remove the patterned photoresist and to remove interconnect layer material that is atop the patterned photoresist, thereby leaving raised areas of interconnect layer atop said selected portions of said barrier plane;

(7) etching said barrier plane using said raised areas of interconnect layer as an etch mask, thereby forming a two-layer interconnect scheme; and (8) on a second side of said flexible piezoelectric membrane, forming a conductive barrier plane;

(9) repeating steps (3) to (7), thereby forming a two-layer interconnect scheme on said second side of said flexible piezoelectric membrane.

17. The method of claim 16 further comprising forming a protective layer on said first side of said flexible piezoelectric membrane following step (7) and preceding step (8).

18. The method of claim 16 wherein said conductive barrier plane is formed by depositing a film including chromium and said interconnect layer is formed by depositing a film including gold.

19. The method of claim 16 wherein forming said conductive barrier plane includes forming focus marks.

* * * * *